US011177422B2

(12) United States Patent
Basalla et al.

(10) Patent No.: US 11,177,422 B2
(45) Date of Patent: Nov. 16, 2021

(54) LED FILAMENT WITH COLORED OFF STATE MASKING

(71) Applicant: CONSUMER LIGHTING (U.S.), LLC, Norwalk, CT (US)

(72) Inventors: Brandie Basalla, Middleburg Heights, OH (US); Kevin J. Benner, Solon, OH (US); Glenn H. Kuenzler, Beachwood, OH (US)

(73) Assignee: SAVANT TECHNOLOGIES LLC, East Cleveland, OH (US)

( * ) Notice: Subject to any disclaimer, the term of this patent is extended or adjusted under 35 U.S.C. 154(b) by 17 days.

(21) Appl. No.: 16/543,508

(22) Filed: Aug. 16, 2019

(65) Prior Publication Data

US 2020/0058835 A1 Feb. 20, 2020

Related U.S. Application Data

(60) Provisional application No. 62/765,060, filed on Aug. 16, 2018.

(51) Int. Cl.
*H01L 33/56* (2010.01)
*H01L 25/075* (2006.01)
*F21K 9/232* (2016.01)
*H01L 33/50* (2010.01)
*F21Y 115/10* (2016.01)

(52) U.S. Cl.
CPC .............. *H01L 33/56* (2013.01); *F21K 9/232* (2016.08); *H01L 25/0753* (2013.01); *H01L 33/502* (2013.01); *F21Y 2115/10* (2016.08)

(58) Field of Classification Search
CPC .... H01L 33/56; H01L 33/502; H01L 25/0753
See application file for complete search history.

(56) References Cited

U.S. PATENT DOCUMENTS

| 2013/0043502 | A1* | 2/2013 | Koya | B29C 39/10 |
| | | | | 257/98 |
| 2016/0351760 | A1* | 12/2016 | Hayashi | H01L 33/48 |
| 2019/0148605 | A1* | 5/2019 | Mu | H01L 33/50 |
| | | | | 257/98 |
| 2019/0195456 | A1* | 6/2019 | Pfeffer | F21S 41/151 |

* cited by examiner

*Primary Examiner* — Marc Anthony Armand
(74) *Attorney, Agent, or Firm* — Wood IP LLC (57) ABSTRACT

An LED filament includes an underlying layer exhibiting a first appearance at a first temperature, and an over-coated layer comprising a thermochromic material that exhibits at the first temperature, a preselected appearance other than the first appearance, and at a second temperature, a transparent or translucent appearance.

32 Claims, 7 Drawing Sheets

LED FILAMENT WITH COLORED OFF STATE MASKING

BACKGROUND

Figure 1A:
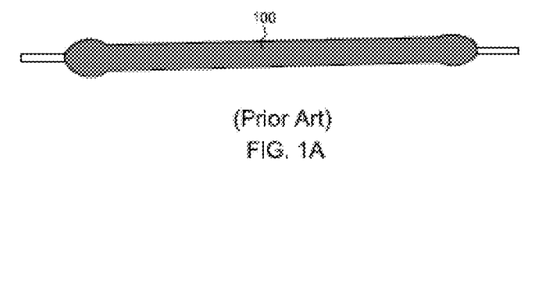
FIGS. 1A-1C show prior art LED filaments with a colored covering in various implementations.
Figure 1B:
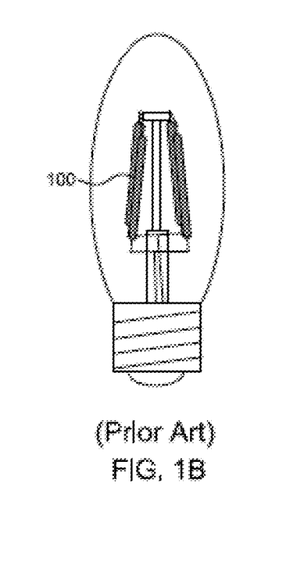
Figure 1C:
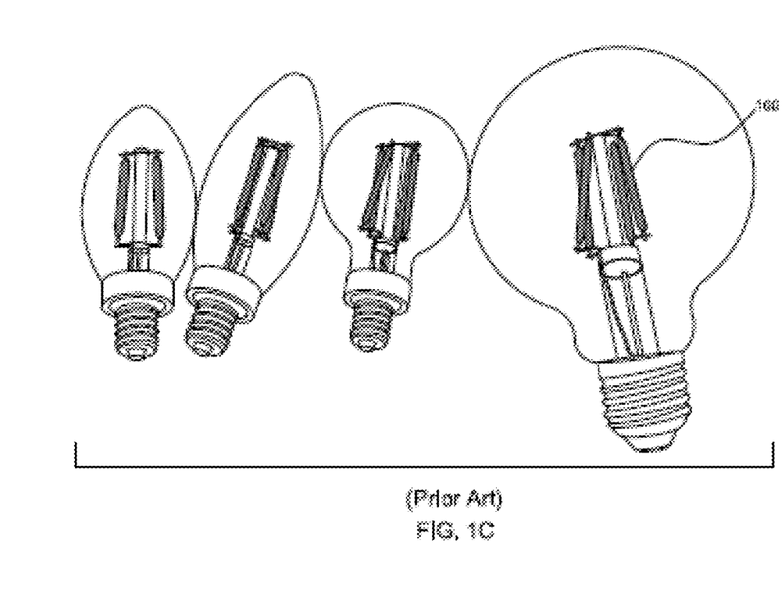

It is typical for a lighting apparatus, such as a light fixture, luminaire, decorative or general purpose lamp, a tube, or other light emitting device or other illumination system, to include one or more light emitting diode (LED) filaments, which are usually composed of a linear series of LED dies arranged on a transparent substrate, supported or held in an envelope to give the appearance of an incandescent filament. For example, the filaments may be constructed with InGaN blue-emitting LED dies carried on a substantially linear glass or sapphire substrate and covered or encapsulated with a phosphor material. Often, the encapsulating material may have a particular color in the un-lit state, for example, yellow. An exemplary LED filament with a yellow covering is shown in FIG. 1A. FIGS. 1B and 1C show LED filaments having a yellow appearance incorporated into different types of lighting apparatus. The appearance of the filaments may be disadvantageous due to objections to the yellow color in the unlit state, especially when used for decorative lamps and general purpose lamps.

SUMMARY

The disclosed embodiments are directed to an LED filament including an underlying layer exhibiting a first appearance at a first temperature, and an over-coated layer comprising a thermochromic material that exhibits at the first temperature, a preselected appearance other than the first appearance, and at a second temperature, a transparent or translucent appearance.

The underlying layer may include a phosphor material.

The underlying layer may include a phosphor material with a doped phosphor and a fluoride host.

The underlying layer may include PFS phosphor ($K_2SiF_6$:$Mn^{4+}$).

The underlying layer may include a garnet phosphor.

The underlying layer may include an Eu-doped (e.g., $Eu^{2+}$) red nitride phosphor.

The underlying layer may include a phosphor material with an absorbing agent.

The first appearance may include a yellow, orange, or red color.

The first temperature may be a non-operating temperature of the LED filament.

The thermochromic material may include a composite thermochromic pigment loaded in a silicone substrate.

The thermochromic material may include a leuco dye microencapsulated with a polymer material.

The preselected appearance may include a preselected color.

The preselected color may include a black, gray, red, yellow, green, blue, or purple color.

The preselected appearance may include a pattern.

The second temperature may be above the first temperature.

The second temperature may be an operating temperature of the LED filament.

A lighting apparatus may include the overcoated LED filament disclosed herein.

The disclosed embodiments are further directed to an LED filament including an a layer comprising a mixture of phosphor and thermochromic material that causes the LED filament to exhibit a preselected appearance at a first temperature, and to become transparent or translucent to light at a second temperature.

The phosphor material may include a doped phosphor and a fluoride host.

The phosphor material may include PFS phosphor ($K_2SiF_6$:$Mn^{4+}$).

The phosphor material may include a garnet phosphor.

The phosphor material may include an Eu-doped (e.g., $Eu^{2+}$) red nitride phosphor.

The phosphor material may include an absorbing agent.

A lighting apparatus may include the LED filament including an a layer comprising a mixture of phosphor and thermochromic material that causes the LED filament to exhibit a preselected appearance at a first temperature, and to become transparent or translucent to light at a second temperature.

BRIEF DESCRIPTION OF THE DRAWINGS

The foregoing aspects and other features of the embodiments are explained in the following description, taken in connection with the accompanying drawings, wherein.

DETAILED DESCRIPTION

Although the disclosed embodiments will be described with reference to the embodiments shown in the drawings and described below, it should be understood that these could be embodied in many alternate forms. In addition, any suitable size, shape or type of elements or materials could be used.

One or more embodiments of the present disclosure are directed to an LED apparatus comprising one or more LED filaments which have a pre-selected appearance at a first temperature and have a transparent or translucent appearance at a second temperature, also referred to as a transition temperature.

This may be accomplished, for example, by providing an overcoating that changes the appearance of the LED filament from a first appearance to a preselected appearance at the first temperature and becomes transparent or translucent at a second temperature while maintaining acceptable performance levels. The disclosed embodiments are directed to minimizing the difference between the spectral power distributions of the filament with and without the overcoat, and minimizing lumen losses and radiated power losses, for example, to approximately less than 9%. In some embodiments, the first appearance may include a yellow, orange, or red color.

Figure 2:
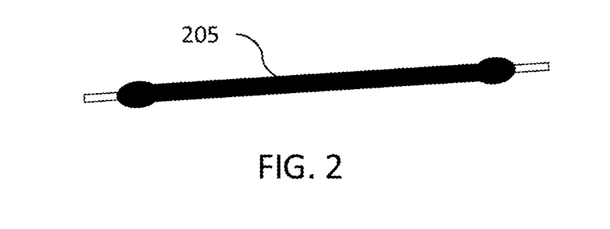
FIG. 2 shows an exemplary LED filament overcoated according to the disclosed embodiments.

An exemplary LED filament overcoated according to the disclosed embodiments is illustrated in FIG. 2. The overcoating may comprise a thermochromic material that causes the LED filament to have a different, preselected, appearance at the first temperature.

The LED filament may have an underlying layer that may include one or more phosphors, such as a $Mn^{4+}$ doped potassium fluorosilicate (PFS) based red phosphor, other $Mn^{4+}$ doped phosphors with fluoride hosts, other $Eu^{2+}$ doped red nitride phosphors, a yellow-green phosphor such as a cerium-doped yttrium aluminum garnet (Ce:YAG) or other garnet compositions. The underlying layer may also include a visible light absorbing agent, for example, $NdF_xO_y$. In some embodiments, the underlying layer may have a yellow, orange, or red color.

The first temperature may be a non-operating temperature of the LED filament, for example, an ambient temperature of an environment in which a lamp incorporating the overcoated LED filament is located, when no power is applied to the overcoated LED filament. In at least one embodiment, an exemplary first temperature might be in the range of approximately 18-28° C. It should be understood that the first temperature may include any temperature or range of temperatures that the overcoated LED filament experiences during periods when no power is applied to the overcoated LED filament.

The overcoating may include a thermochromic material loaded in a silicone substrate or other polymeric or resinous substrate. Other embodiments may include the thermochromic material encapsulated in polymer microspheres within the substrate. In one or more embodiments, the overcoating may have the same mechanical, or other suitable properties, as those of the underlying layer. The silicone substrate and polymer microspheres may generally be optically clear, able to withstand the temperatures and incident flux incurred as part of the disclosed embodiments. The viscosity of the uncured overcoating should be suitable for the different processes used to apply the overcoating, e.g. low viscosity for spraying or high viscosity for extruding. A thickness of the overcoating may also be chosen to provide the preselected appearance, such as a thicker or thinner filament.

An example of the thermochromic material may include a composite thermochromic pigment, also referred to as a leuco dye type pigment, composed of at least a pH sensitive dye, an acid proton donor, and a hydrophobic solvent. The pH sensitive dye may include one or more spirolactones, fluorans, spiropyrans, and fulgides. The acid proton donor may include one or more of 1,2,3-triazole derivatives, 4-hydroxycoumarin, parabens, and bisphenol A. The hydrophobic solvent may include one or more alcohols, amides, and fatty acids. The pH sensitive dye, acid proton donor, and hydrophobic solvent may be mixed together to achieve the preselected appearance at or below the first temperature, and to achieve a transparent or translucent appearance at or above a second or transition temperature, and the resulting composite thermochromic pigment may be loaded in a silicone or other polymer substrate. According to the disclosed embodiments, the second temperature may be one or more of a temperature greater than the first temperature and an operating temperature of the LED filament. In some embodiments, an exemplary second, or transition temperature may be equal to or greater than approximately 33° C. In at least one embodiment, an exemplary second temperature might be in the range of approximately 20-60° C.

In some embodiments, the mixture may be encapsulated in polymer microspheres. In at least one embodiment, the preselected appearance may include a color, and the pH sensitive dye may be selected to achieve a particular color, for example, gray, red, yellow, blue, or purple. Thermochromic material may include material described in Bamfield, P. Chromic Phenomena, The Technical Applications of Coulor Chemistry, Cambridge, UK, The Royal Society of Chemistry, 2001, incorporated by reference in its entirety.

While the disclosed embodiments are described in the context of overcoating a filament with a pre-existing underlayer of a phosphor material, it should be understood that the disclosed embodiments also include a coating that includes the thermochromic material and the phosphor material together, applied as a layer to the series of LED dies arranged on a transparent substrate. It should also be understood that the disclosed embodiments further include a layer applied to the LED dies that may include phosphor material covered by a thermochromic material. For example, particles comprising one or more phosphors may be encapsulated by a thermochromic material. The encapsulated particles may be loaded in a silicone or other polymer substrate and applied to the LED dies. When the LED dies are below the transition temperature, the LED filament may have the preselected appearance, and as the LED filament temperature is at or exceeds the transition temperature, the thermochromic material becomes transparent.

Figure 3A:
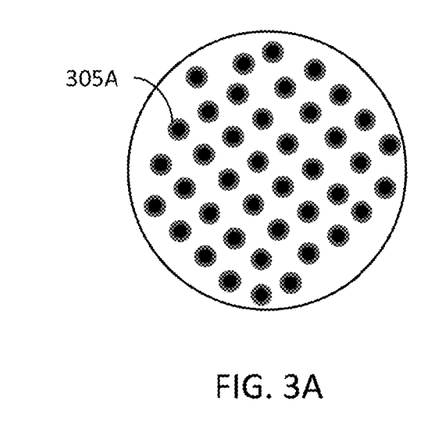
FIGS. 3A and 3B show characteristics of a composite thermochromic pigment with respect to temperature.
Figure 3B:
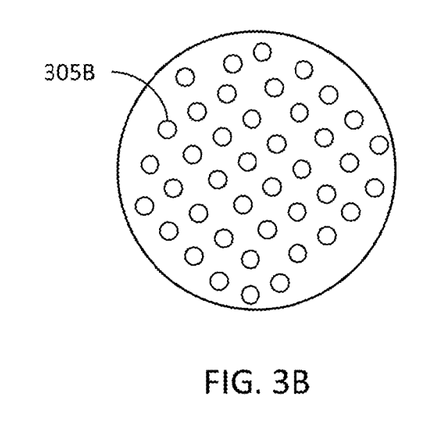

Referring to FIG. 3A, at the first temperature, the composite thermochromic pigment 305A may be a solid within the microspheres. As the temperature rises, the composite thermochromic pigment may be liquefied and interaction of the pH sensitive dye and the proton donor is inhibited, leading to a negative thermochromic effect 305B and a loss of color, where the composite thermochromic pigment becomes transparent or translucent, as shown in FIG. 3B. As the temperature falls, the effect is reversed and the composite thermochromic pigment may return to its original appearance.

As an example, the pH sensitive dye, acid proton donor, and hydrophobic solvent may be mixed together in a specific ratio to achieve the preselected appearance in the form of a preselected color at the first temperature. The mixture may be encapsulated in microspheres and applied as an overcoating to an LED filament. As power is applied to the LED filament, the temperature increases to, or exceeds, the second or transition temperature, which may cause the overcoating to lose color and become transparent or translucent.

When power is removed and the filament cools, the overcoating may return to its preselected color. While the preselected color is illustrated as black, it should be understood that the preselected color may include any color, for example, black, gray, red, yellow, green, blue, or purple.

Figure 4A:
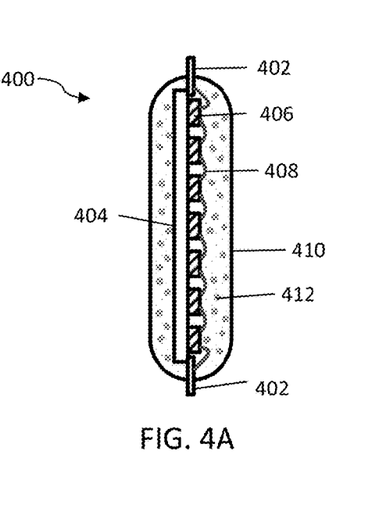
FIGS. 4A-4F illustrate a comparison of excitation and emission processes of conventional LED filaments and LED filaments of the disclosed embodiments.
Figure 4B:
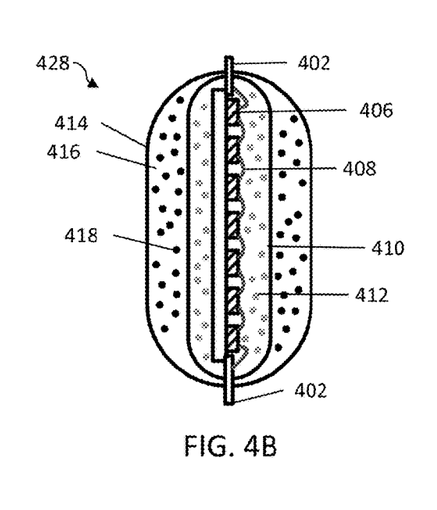

FIGS. 4A-4F further illustrate the phenomena exhibited by the disclosed embodiments. FIG. 4A a conventional LED filament 400. Metal leads 402 are typically attached to a substrate 404 on which are mounted a series of LED dies 406. The metal leads 402 and LED dies 406 are electrically coupled by wire bonds 408 and the assembly is encapsulated using an underlying layer 410 which typically includes phosphor particles 412. As shown in FIG. 4B, the LED filament may be over-coated with a layer 414 comprising a silicone substrate 416 loaded with microspheres encapsulating the thermochromic material 418.

Figure 4C:
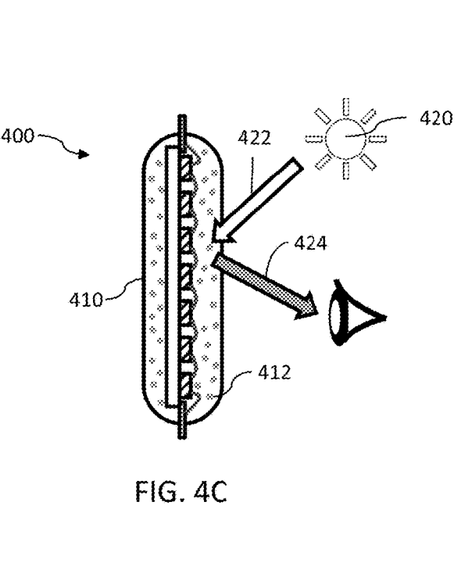
Figure 4D:
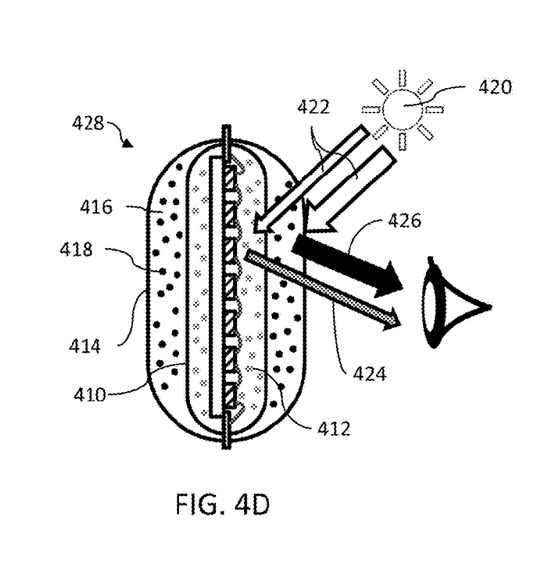

FIGS. 4C and 4D depict the differences in appearance of the LED filaments 400, 428 in the unlit state when the phosphor undercoating appears yellow. Referring to FIG. 4C, a light source 420 provides white light 422 that impinges on the underlying layer 410. The phosphor particles 412 absorb the blue portion of the incident light and reflect the non-absorbed part 424, resulting in a yellow appearance. In the example shown in FIG. 4D, the light source 420 also provides white light 422, however most of the white light is selectively absorbed by the over-coated layer 414 of the silicone substrate 416 loaded with the thermochromic material 418. Very little light 422 passes through the over-coated layer 414 and is reflected from the underlying layer 410. The light 426 reflected from the over-coated layer 414 is seen as the preselected appearance or color determined by the thermochromic material when the LED filament is in the unlit state at the non-operating temperature. The light 424 reflected from the underlying layer 410 may be yellow, but the portion of the light 422 reflected from the underlying layer 410 passing though the thermochromic material is negligible, such that the appearance of the overcoated LED filament is the preselected appearance or color.

Figure 4E:
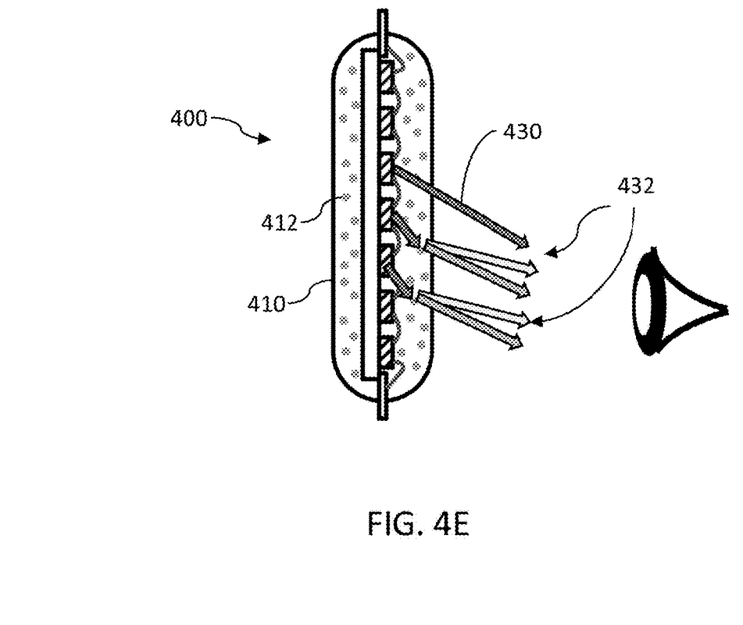
Figure 4F:
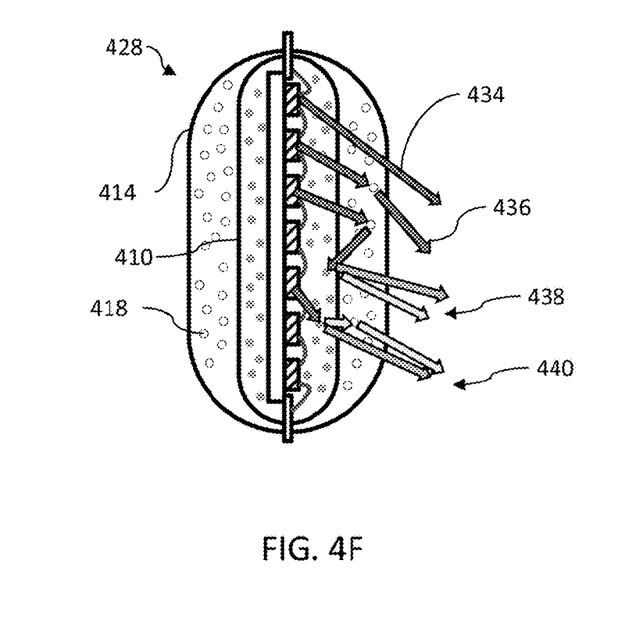

FIGS. 4E and 4F show the operations of the conventional LED filament 400, and the over-coated LED filament 428 when power is applied. As shown in FIG. 4E, in the conventional LED filament 400, some blue bleed through occurs, that is, some of the blue light 430 from the LED dies passes through the underlying layer 410 without being absorbed by the phosphor particles 412. Most of the blue light is absorbed by the phosphor particles 412 and is re-emitted as light 432 with longer wavelengths, generally resulting in the emission of white light. As shown in FIG. 4F, when power is applied causing the LED filament temperature to exceed the transition temperature, the thermochromic material becomes transparent or translucent and some of the blue light 434 from the LED dies passes through both the underlying layer 410 and the over-coated layer 414 without being absorbed or scattered. Some of the blue light passes through the underlying layer 410, and the light 436 may be scattered by the over-coated layer 414 without any color change. Some of the blue light passes through the underlying layer 410, and may be scattered back into the underlying layer 410, where it may be re-absorbed and re-emitted 438. This results in lower blue bleed through and higher phosphor emission. As indicated by 440, the over-coating layer 414 may scatter phosphor emission from the underlying layer 410, but the scattering does not change the light's color.

Figure 5:
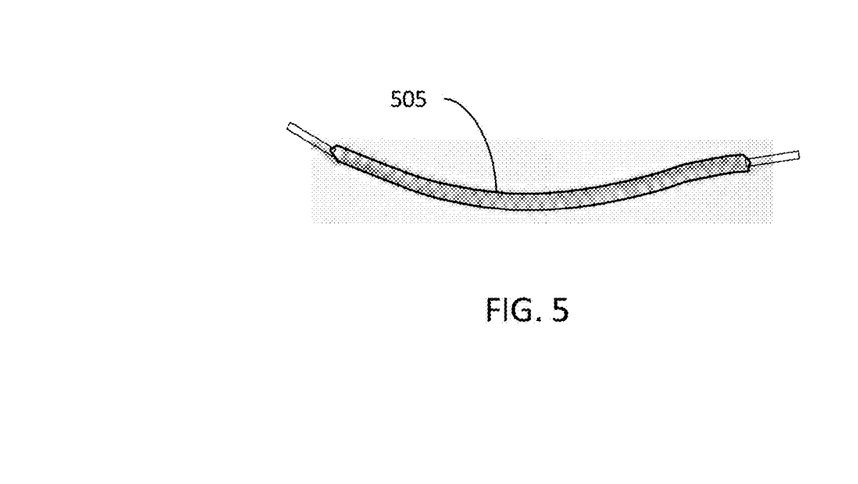
FIG. 5 shows an exemplary LED filament overcoated to achieve a preselected appearance that includes a pattern, according to the disclosed embodiments.

As a further example of a preselected appearance, the pH sensitive dye, acid proton donor, and hydrophobic solvent may be mixed together in different combinations and optionally with different coloring agents to achieve a preselected appearance that includes a pattern. As shown in FIG. 5, an exemplary pattern might include one or more of colors and shadings that may give an LED filament 505 an appearance of a tungsten filament. The disclosed embodiments may include any other suitable colors, shadings, or patterns. In some embodiments, a pattern may include one or more molded shapes.

The composite thermochromic pigment may be loaded in a silicone or other resinous substrate or encapsulated in polymer microspheres, and might be applied to an LED filament by dipping, spraying, brushing, overmolding, or extruding the loaded silicone substrate or polymer microspheres onto the filament, or by some other process. One or more of these processes might be used to apply one or more thermochromic or other materials, in one or more layers, to the filament to achieve a particular preselected appearance.

Alternatively, the pigment-loaded material may be applied to a larger component of the lighting device, the larger component composing of the filament along with additional components. For example, the lead frame or mount may be dipped into or sprayed with the pigment-loaded material.

Table 1 below shows the difference in correlated color temperature, Duv shift, lumens per watt, and radiant power between an exemplary standard LED filament and an exemplary thermochromic material overcoated LED filament.

TABLE 1

|  | CCT | Duv | LPW | Radiant Power |
|---|---|---|---|---|
| Standard LED filament | 2847 | 0.0002 | 161.9 | 0.482 |
| Overcoated LED filament | 2668 | 0.0021 | 146.9 | 0.440 |

Figure 6:
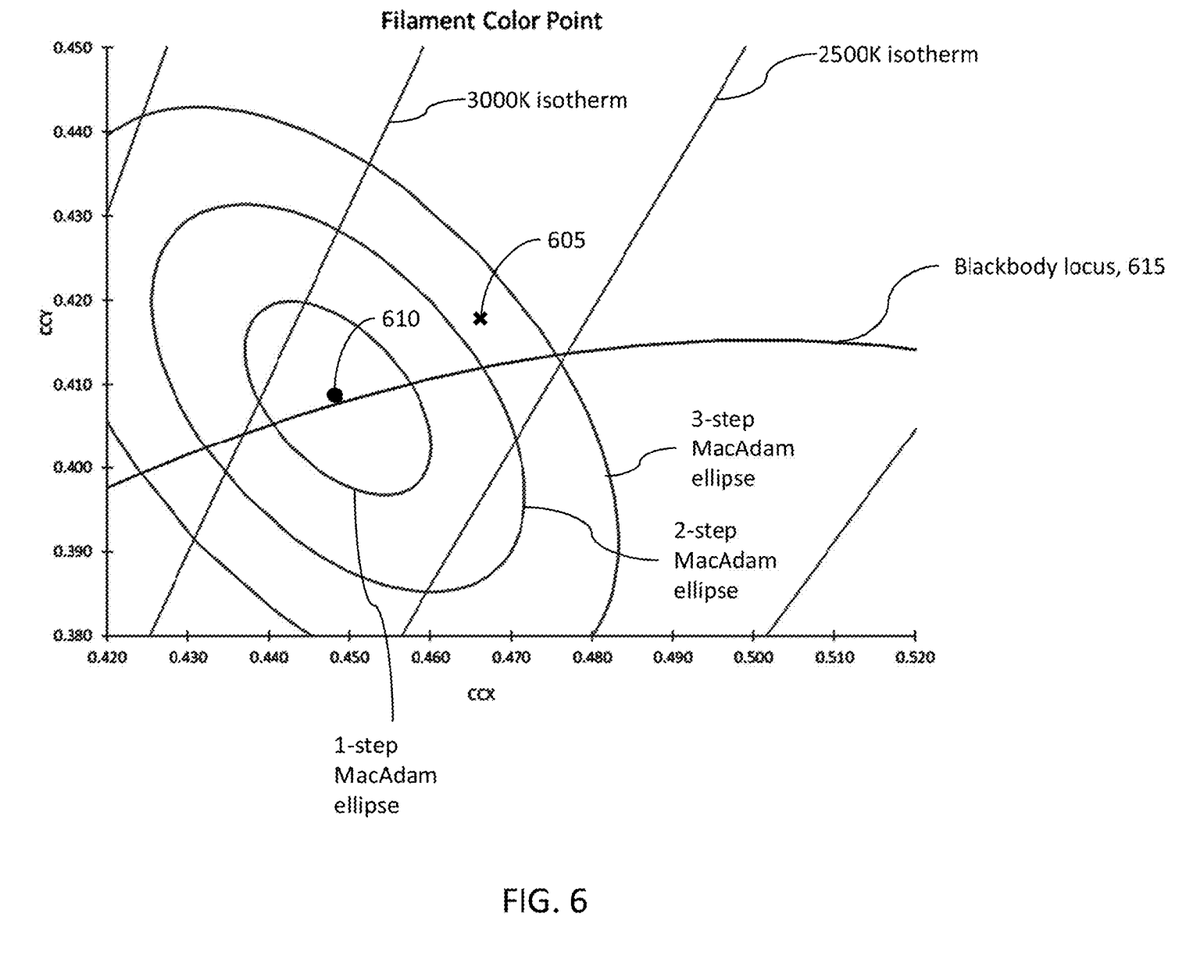
FIG. 6 shows exemplary color points of an LED filament without an overcoating and an LED filament with an overcoating, according to the disclosed embodiments.

FIG. 6 shows an exemplary color point 605 of an LED filament without an overcoating and an exemplary color point 610 of an LED filament with an overcoating according to the disclosed embodiments. Total shift in the color point in the CIE 1931 color space is approximately 2.5 steps for this exemplary embodiment. Increased phosphor absorption causes the color point to shift to a warmer CCT as indicated in Table 1, and away from the blackbody locus 615.

Figure 7:
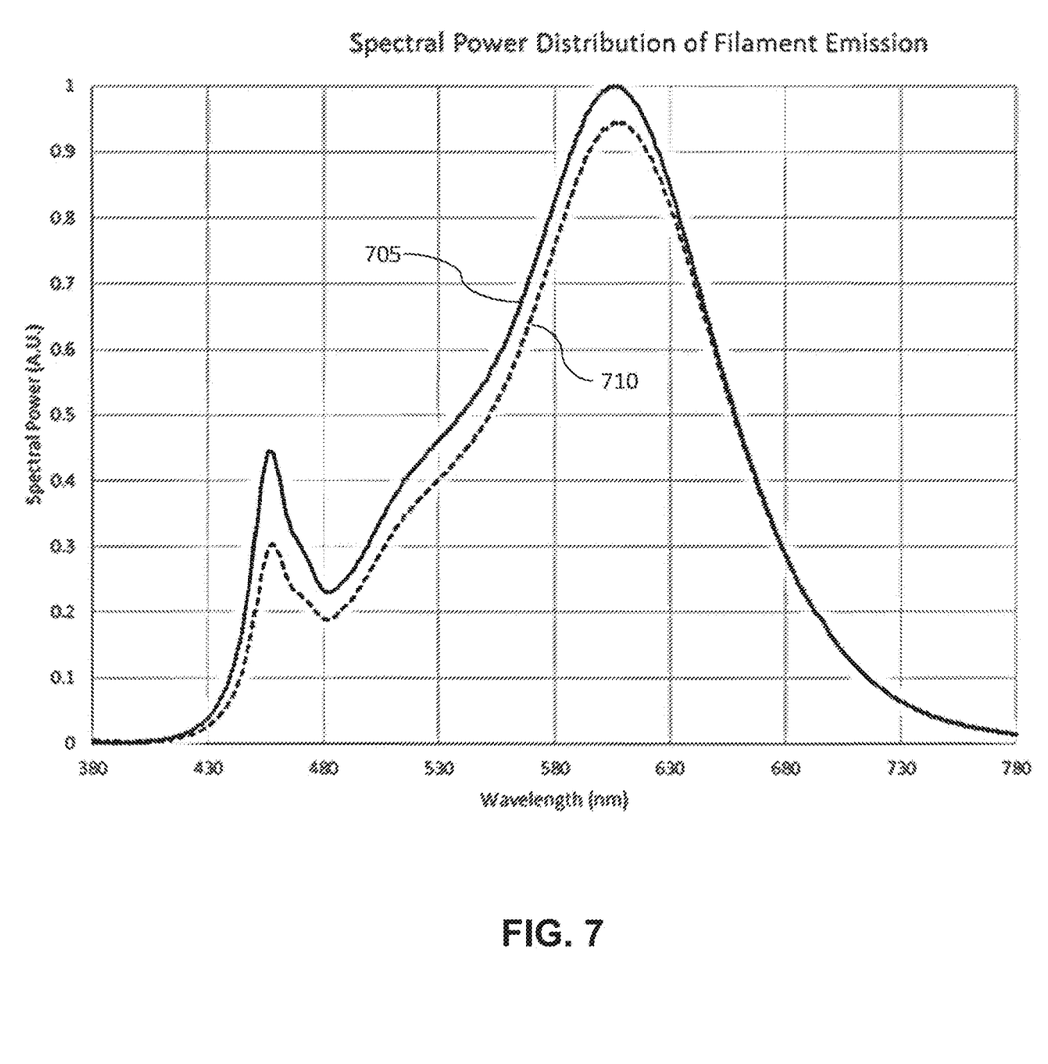
FIG. 7 illustrates the spectral power distributions of the LED filaments with and without the overcoating.

FIG. 7 shows an exemplary spectral power distribution of an LED filament without an overcoating 705 and an LED filament with an overcoating 710. The spectral power of the overcoated filament 710 may be less than that of the uncoated filament 705, indicating some loss of emitted light, which may be caused by a slight absorption of light by the overcoated layer 710, as well as absorption by the underlying layer and filament structure due to the diffusion caused by the translucent overcoated layer. Loss is most significant in the blue region, explaining the shift of the color point to warmer CCT and away from the blackbody locus.

Figure 8:
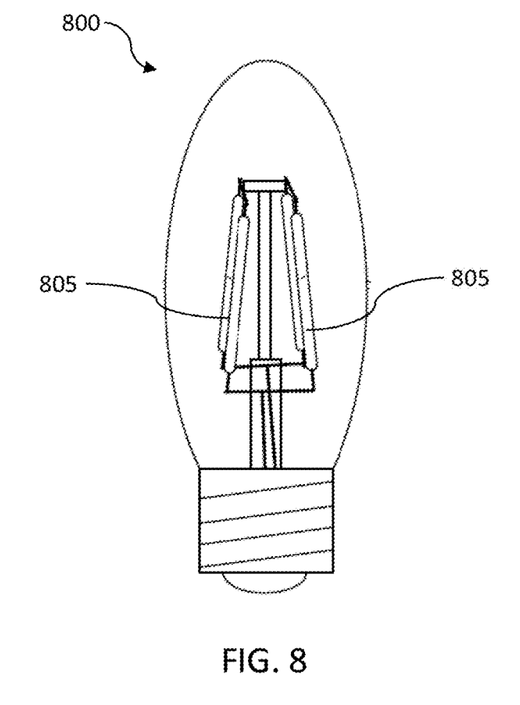
FIG. 8 shows a lighting apparatus incorporating an overcoated LED filament as disclosed herein.

FIG. 8 shows a lighting apparatus 800 incorporating overcoated LED filaments 805 as disclosed herein.

It is noted that the embodiments described herein can be used individually or in any combination thereof. It should be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

Various modifications and adaptations may become apparent to those skilled in the relevant arts in view of the foregoing description, when read in conjunction with the accompanying drawings. However, all such and similar modifications of the teachings of the disclosed embodiments will still fall within the scope of the disclosed embodiments.

Various features of the different embodiments described herein are interchangeable, one with the other. The various described features, as well as any known equivalents can be mixed and matched to construct additional embodiments and techniques in accordance with the principles of this disclosure.

Furthermore, some of the features of the exemplary embodiments could be used to advantage without the corresponding use of other features. As such, the foregoing description should be considered as merely illustrative of the principles of the disclosed embodiments and not in limitation thereof.

What is claimed is:

1. An LED filament comprising:
    an underlying layer encapsulating a series of LED dies of the LED filament exhibiting a first appearance at a first temperature; and
    an over-coated layer comprising a thermochromic material that exhibits at the first temperature, a preselected appearance other than the first appearance, and at a second temperature, a transparent or translucent appearance,
    wherein the thermochromic material comprises a composite thermochromic pigment loaded in a substrate, the thermochromic pigment comprising a leuco dye, and
    wherein the over-coated layer encapsulates the underlying layer such that at the first temperature the color of the LED filament is the preselected appearance as determined by the thermochromic material.

2. The LED filament of claim 1, wherein the underlying layer comprises a phosphor material.

3. The LED filament of claim 1, wherein the underlying layer comprises a phosphor material with a doped phosphor and a fluoride host.

4. The LED filament of claim 1, wherein the underlying layer comprises PFS phosphor ($K_2SiF_6:Mn^{4+}$).

5. The LED filament of claim 1, wherein the underlying layer comprises a garnet phosphor.

6. The LED filament of claim 1, wherein the underlying layer comprises an Europium-doped red nitride phosphor.

7. The LED filament of claim 1, wherein the underlying layer comprises a phosphor material with an absorbing agent.

8. The LED filament of claim 1, wherein the first appearance includes a yellow, orange, or red color.

9. The LED filament of claim 1, wherein the first temperature is a non-operating temperature of the LED filament.

10. The LED filament of claim 1, wherein the composite thermochromic pigment is loaded in a silicone substrate.

11. The LED filament of claim 1, wherein the leuco dye is microencapsulated with a polymer material.

12. The LED filament of claim 1, wherein the preselected appearance comprises a preselected color.

13. The LED filament of claim 12, wherein the preselected color comprises a black, gray, red, yellow, green, blue, or purple color.

14. The LED filament of claim 1, wherein the preselected appearance comprises a pattern.

15. The LED filament of claim 1, wherein the second temperature is above the first temperature.

16. The LED filament of claim 1, wherein the second temperature is an operating temperature of the LED filament.

17. A lighting apparatus comprising the overcoated LED filament of claim 1.

18. An LED filament comprising:
    a layer encapsulating a series of LED dies of the LED filament comprising a mixture of phosphor and thermochromic material that causes the LED filament to exhibit a preselected appearance at a first temperature, and to become transparent or translucent to light at a second temperature,
    wherein the thermochromic material comprises a composite thermochromic pigment loaded in a substrate, the thermochromic pigment comprising a leuco dye, and
    wherein at the first temperature, the preselected appearance of the LED filament is determined by the thermochromic material.

19. The LED filament of claim 18, wherein the phosphor material comprises a doped phosphor and a fluoride host.

20. The LED filament of claim 18, wherein the phosphor material comprises PFS phosphor ($K_2SiF_6:Mn^{4+}$).

21. The LED filament of claim 18, wherein the phosphor material comprises a garnet phosphor.

22. The LED filament of claim 18, wherein the phosphor material comprises an $Eu^+$ red nitride phosphor.

23. The LED filament of claim 18, wherein the phosphor material comprises an absorbing agent.

24. The LED filament of claim 18, wherein the first temperature is a non-operating temperature of the LED filament.

25. The LED filament of claim 18, wherein the composite thermochromic pigment is loaded in a silicone substrate.

26. The LED filament of claim 18, wherein the leuco dye is microencapsulated with a polymer material.

27. The LED filament of claim 18, wherein the preselected appearance comprises a preselected color.

28. The LED filament of claim 27, wherein the preselected color comprises a black, gray, red, yellow, green, blue, or purple color.

29. The LED filament of claim 18, wherein the preselected appearance comprises a pattern.

30. The LED filament of claim 18, wherein the second temperature is above the first temperature.

31. The LED filament of claim 18, wherein the second temperature is an operating temperature of the LED filament.

32. A lighting apparatus comprising the LED filament of claim 18.

* * * * *